(12) United States Patent
Varadarajan et al.

(10) Patent No.: US 9,053,799 B2
(45) Date of Patent: Jun. 9, 2015

(54) OPTIMIZING FUSEROM USAGE FOR MEMORY REPAIR

(71) Applicant: Texas Instruments Incorporated, Dallas, TX (US)

(72) Inventors: Devanathan Varadarajan, Bangalore (IN); Harsharaj Ellur, Bangalore (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 89 days.

(21) Appl. No.: 14/038,306

(22) Filed: Sep. 26, 2013

(65) Prior Publication Data

US 2015/0012786 A1    Jan. 8, 2015

(30) Foreign Application Priority Data

Jul. 2, 2013    (IN) .............................. 528/CHE/2013

(51) Int. Cl.
| | |
|---|---|
| *G11C 29/00* | (2006.01) |
| *G11C 17/16* | (2006.01) |
| *G11C 17/18* | (2006.01) |
| *G11C 29/44* | (2006.01) |

(52) U.S. Cl.
CPC ................ *G11C 17/16* (2013.01); *G11C 17/18* (2013.01); *G11C 29/4401* (2013.01); *G11C 2029/4402* (2013.01)

(58) Field of Classification Search
CPC ........... G11C 29/12; G11C 2029/3202; G11C 2029/1208; G11C 29/14; G11C 29/846; G11C 29/808; G11C 17/18; G11C 29/72; G11C 29/802; G11C 29/027; G11C 29/848; G01R 31/318558; G01R 31/318505; G01R 31/318516; G01R 31/31813; G06F 11/267; G06F 11/2215

See application file for complete search history.

(56) References Cited

U.S. PATENT DOCUMENTS

| | | | | |
|---|---|---|---|---|
| 6,363,020 | B1 * | 3/2002 | Shubat et al. ................. | 365/200 |
| 2003/0237033 | A1 * | 12/2003 | Borri et al. .................... | 714/718 |
| 2007/0258296 | A1 * | 11/2007 | Bright et al. .................. | 365/200 |
| 2009/0190422 | A1 | 7/2009 | Khoja et al. | |
| 2013/0031319 | A1 * | 1/2013 | Gorman et al. ............... | 711/157 |

* cited by examiner

*Primary Examiner* — Guerrier Merant
(74) *Attorney, Agent, or Firm* — John R. Pessetto; Frank D. Cimino (57) ABSTRACT

A memory repair system in an integrated circuit (IC) that optimizes the fuseROM used for memory repair. The IC includes a plurality of memory wrappers. Each memory wrapper includes a memory block with a fuse register and a bypass register. The bypass register has a bypass data that indicates a defective memory wrapper of the plurality of memory wrappers. A fuseROM controller is coupled to the plurality of memory wrappers. A memory bypass chain links the bypass registers in the plurality of memory wrappers with the fuseROM controller. The fuseROM controller loads the bypass data in the memory bypass chain. A memory data chain links the fuse registers in the plurality of memory wrappers with the fuseROM controller. The memory data chain is re-configured to link the fuse registers in a set of defective memory wrappers of the plurality of memory wrappers responsive to the bypass data loaded in the memory bypass chain.

18 Claims, 5 Drawing Sheets

OPTIMIZING FUSEROM USAGE FOR MEMORY REPAIR

TECHNICAL FIELD

Embodiments of the disclosure relate generally to integrated circuits and more particularly to reducing the area required for repairing plurality of memories on an integrated circuit.

BACKGROUND

Integrated circuits (ICs) generally include various modules combined to perform various functions. For example, a digital signal processor (DSP) includes processor and memory blocks embedded in the IC. The memory blocks containing plurality of addressable memory locations are tested for defects, ensuring the operability of the IC. To test these blocks, special test circuits, referred to as "Built-In Self Test" (BIST) circuits are incorporated into the IC. BIST circuits generate a test pattern to determine whether the memory block is defective or not. In some cases the circuit provides redundant rows and/or columns that are used to repair defective rows and columns in the memory block.

Electronic fuse or Efuse or fuseROM is also used for memory repair. fuseROM store a repair data or repair signature that identifies a defective element in the memory block. A repair signature for all the memory blocks under test is stored in the fuseROM. The repair signature is used for repair of the memory blocks. In a system with many memories, the size of the fuseROM is directly related to the sum of the number of memory blocks under test.

With increasing memories in today's SoCs (System-on-chip), memory repair has become crucial to improve yield in low process technologies such as 45 nm and below. It has been observed across multiple SoCs, that fuseROM area is increasingly becoming an area bottleneck, partly due to the fact that fuseROM utilization is very poor even after memory repair. The repair data load time (autoload time) is a time required to load the repair data from the fuseROM to the plurality of memory blocks. Additionally, for devices where wakeup time is crucial, the repair data load time (autoload time) forms a significant portion of the overall boot time or activation time.

Thus, there is a need to efficiently test memories without requiring an enormous fuseROM area, with low autoload time and without compromising on memory reparability or test quality.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

An embodiment provides an integrated circuit that includes a plurality of memory wrappers. Each memory wrapper includes a memory block with a fuse register and a bypass register. The bypass register have a bypass data that indicates a defective memory wrapper of the plurality of memory wrappers. A fuseROM controller is coupled to the plurality of memory wrappers. A memory bypass chain links the bypass registers in the plurality of memory wrappers with the fuseROM controller. The fuseROM controller loads the bypass data in the memory bypass chain. A memory data chain links the fuse registers in the plurality of memory wrappers with the fuseROM controller. The memory data chain is re-configured to link the fuse registers in a set of defective memory wrappers of the plurality of memory wrappers responsive to the bypass data loaded in the memory bypass chain.

An example embodiment provides an integrated circuit that includes a plurality of memory wrappers. Each memory wrapper comprises a memory block with a fuse register and a bypass register. The bypass register have a bypass data that indicates a defective memory wrapper of the plurality of memory wrappers. A BISR (built-in self-repair) controller is coupled to each memory wrapper of the plurality of memory wrappers. The BISR controller self repairs each memory wrapper. A fuseROM controller is coupled to the BISR controller and to the plurality of memory wrappers. A fuseROM is coupled to the fuseROM controller. The fuseROM includes a memory data storage that stores a repair data corresponding to each defective memory wrapper and a memory bypass storage that stores the bypass data corresponding to each memory wrapper. A memory bypass chain links the bypass registers in the plurality of memory wrappers with the fuseROM controller. The fuseROM controller loads the bypass data in the memory bypass chain. A memory data chain is configured to link the fuse registers in the plurality of memory wrappers with the fuseROM controller. The memory data chain is re-configured to link the fuse registers in a set of defective memory wrappers of the plurality of memory wrappers responsive to the bypass data loaded in the memory bypass chain.

An embodiment provides a method of repairing one or more memory wrappers on an integrated circuit. A bypass data corresponding to each memory wrapper of the one or more memory wrappers is stored in a memory bypass storage. The bypass data is configured to indicate a defective memory wrapper of the one or more memory wrappers. A repair data corresponding to each defective memory wrapper is stored in a memory data storage. The bypass data is loaded in a memory bypass chain. The memory bypass chain links the bypass register of each memory wrapper of the one or more memory wrappers. The repair data is loaded in a memory data chain that links each defective memory wrapper of the one or more memory wrappers.

Another embodiment provides a method of self repairing one or more memory wrappers on an integrated circuit. A bypass data is generated for each memory wrapper of the one or more memory wrappers. The bypass data indicates a defective memory wrapper. A repair data is generated for each defective memory wrapper of the one or more memory wrappers. One or more fuses of a fuseROM are blown to store the repair data corresponding to each defective memory wrapper in a memory data storage of the fuseROM. The bypass data corresponding to each memory wrapper is stored in a memory bypass storage of the fuseROM. The bypass data is loaded in a bypass register of each memory wrapper of the one or more memory wrappers. The repair data is loaded in a memory data chain configured to link each defective memory wrapper of the one or more memory wrappers.

An example embodiment provides a method of incremental repairing one or more memory wrappers on an integrated circuit. A bypass data corresponding to each memory wrapper of the one or more memory wrapper is stored in a memory bypass storage. The bypass data indicates a defective memory wrapper. A repair data corresponding to each defective memory wrapper is stored in a memory data storage. The bypass data is loaded in a bypass register of each memory wrapper of the one or more memory wrappers. The repair data is loaded in a memory data chain configured to link each defective memory wrapper of the one or more memory wrappers. The one or more memory wrappers are tested to identify one or more new defective memory wrappers. A bypass data corresponding to each memory wrapper of the one or more memory wrapper is stored in a new memory bypass storage. The bypass data indicates if a memory wrapper is defective. A repair data corresponding to each new defective memory wrapper of the one or more new defective memory wrappers is stored in a new memory data storage. The bypass data is loaded in the bypass register of each memory wrapper of the one or more memory wrappers. The repair data is loaded in a memory data chain configured to link each new defective memory wrapper of the one or more memory wrappers Other aspects and example embodiments are provided in the Drawings and the Detailed Description that follows.

DETAILED DESCRIPTION OF THE EMBODIMENTS

Figure 1:
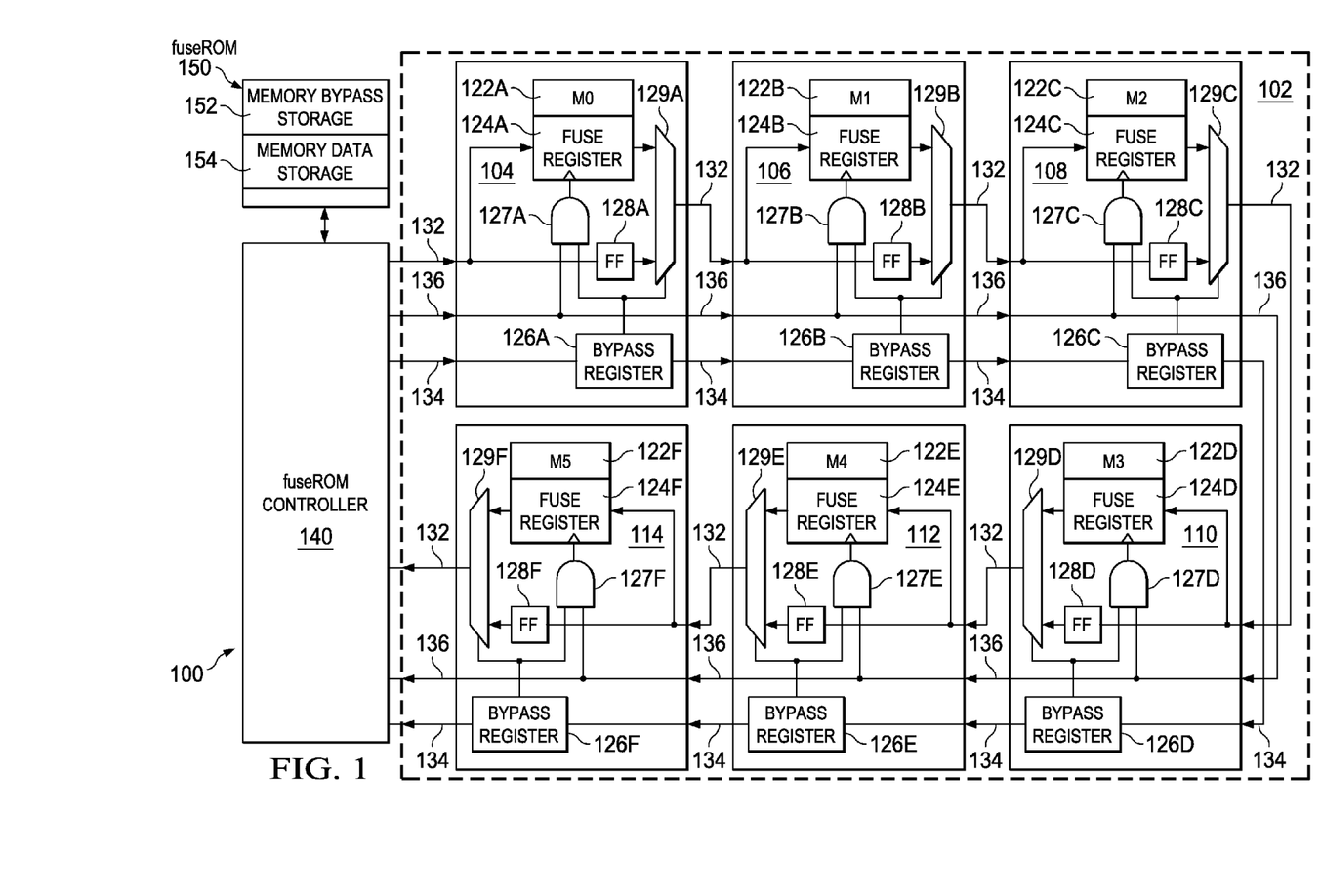
FIG. 1 illustrates a block diagram of a memory repair system in an integrated circuit (IC), according to an embodiment.

FIG. 1 illustrates a block diagram of a memory repair system in an integrated circuit (IC) 100, according to an embodiment. The IC 100 includes a plurality of memory wrappers 102, for example memory wrapper 104, 106, 108, 110, 112 and 114. Each memory wrapper includes a memory block e.g. memory blocks M0 122A, M1 122B, M2 122C, M3 122D, M4 122E and M5 122F. As illustrated, the memory wrapper 104 includes a memory block M0 122A and memory wrapper 106 includes a memory block M1 122B. In another embodiment, each memory wrapper includes a plurality of memory blocks. Each memory block has a fuse register e.g. fuse register 124A, 124B, 124C, 124D, 124E and 124F. Each memory wrapper also includes a bypass register e.g. bypass register 126A, 126B, 126C, 126D, 126E and 126F. Each memory wrapper includes a clock-gate e.g. clock-gate 127A, 127B, 127C, 127D, 127E and 127F. The clock-gate 127A receives an output of the bypass register 126A and a memory clock 136. The fuse register 124A receives the memory clock 136 through the clock-gate 127A. Each memory wrapper includes a flip-flop e.g. flip-flop 128A, 128B, 128C, 128D, 128E and 128F. Each memory wrapper includes a multiplexer e.g. multiplexer 129A, 129B, 129C, 129D, 129E and 129F. The multiplexer 129A receives an output of the flip-flop 128A and an output of the fuse register 124A. The multiplexer 129A is configured to generate an output signal in response to an output of the bypass register 126A. A fuseROM controller 140 is coupled to the plurality of memory wrappers 102. In one embodiment, the fuseROM controller 140 is coupled to one or more memory wrappers. A memory data chain 132 links the fuseROM controller 140 to the fuse registers 124A, 124B, 124C, 124D, 124E and 124F in the plurality of memory wrappers 102. The memory data chain 132 also serves as an input to the flip-flops 128A, 128B, 128C, 128D, 128E and 128F. A memory bypass chain 134 is configured to link the fuseROM controller 140 to the bypass registers 126A, 126B, 126C, 126D, 126E and 126F in the plurality of memory wrappers 102. The memory clock 136 from the fuseROM controller 140 is provided to the clock-gate 127A, 127B, 127C, 127D, 127E and 127F in the plurality of memory wrappers 102. A fuseROM 150 is coupled to the fuseROM controller 140. The fuseROM includes a memory bypass storage 152 and a memory data storage 154. Additionally, embodiments including the IC 100 with a single memory wrapper are contemplated. The IC 100 may include one or more additional components known to those skilled in the relevant art and are not discussed here for simplicity of the description.

The integrated circuit 100 is designed for any desired function, and includes circuitry and the plurality of memory blocks M0-M5 to implement that function. In one embodiment, the memory blocks M0-M5 are caches implemented in a microprocessor or other arrays implemented in the microprocessor (e.g. translation lookaside buffers etc.). In an alternative embodiment, the integrated circuit 100 includes one or more processors and supporting circuitry (e.g. the fuseROM controller 140) in an integrated processor configuration (e.g. a microcontroller or embedded processor). In such an implementation, the memory blocks M0-M5 include caches or other memories for the processor, memories for the supporting circuitry, etc. In another embodiment, one or more processors and one or more peripheral circuits (e.g. I/O interface circuits or integrated I/O peripherals) are included in an SOC configuration. The memory blocks M0-M5 would then include caches or other memories for the processor, memories for the peripheral circuits, etc. In an embodiment, the integrated circuit 100 includes no processors and is a fixed-function integrated circuit such as an application specific integrated circuit (ASIC). The memory blocks M0-M5 in this case are arrays used by the fixed-function circuitry. Generally, as used herein, a memory is any storage implemented on an integrated circuit. For example, memory includes SRAM, DRAM, DDR memory, SDRAM, etc. In an embodiment, the memory blocks M0-M5 are different from each other i.e. for example memory blocks M0-M2 are SRAM memories and memory blocks M3-M5 are DDR memories.

Each memory wrapper of the plurality of memory wrappers 102 is similar in connections and operation. Therefore, the operation of memory wrapper 104 is explained now and the operation of the other memory wrappers is not discussed here for simplicity of the description.

The memory wrapper 104 includes a clock-gate 127A that receives the memory clock 136. The memory clock 136 is used to clock the fuse register 124A. The memory bypass chain 134 links the fuseROM controller 140 to the bypass register 126A. The memory bypass storage 152 stores a bypass data corresponding to each memory wrapper of the plurality of memory wrappers 102. The memory bypass storage 152 stores a bypass data corresponding to the memory wrapper 104. The fuseROM controller 140 loads the bypass data from the memory bypass storage 152 in the bypass register 126A. The bypass data in the bypass register 126A indicates if the memory wrapper 104 is defective. The memory data chain 132 links the fuseROM controller 140 to the fuse register 124A. The memory data storage 154 stores a repair data corresponding to each defective memory wrapper. The memory data storage 154 stores a repair data corresponding to the memory wrapper 104 if the bypass data in the bypass register 126A indicates that the memory wrapper 104 is defective. When the bypass data in the bypass register 126A is equal to an index value, the memory wrapper 104 is defective. The bypass data in the bypass register 126A is compared with the index value to identify a defective memory wrapper. In one embodiment, the index value is a set of bits predefined in the IC 100. The clock-gate 127A provides a memory clock 136 to the fuse register 124A when the bypass data in the bypass register 126A is equal to the index value. The repair data on the memory data chain 132 is provided to the fuse register 124A. The fuse register 124A generates a fuse register signal which is provided to the multiplexer 129A.

The repair data on the memory data chain 132 is provided to the flip-flop 128A that generates a flip-flop signal. The flip-flop signal is the same as the repair data on the memory data chain 132 as the function of the flip-flop 128A is just to add delay to the repair data by a predefined time period. The flip-flop 128A provides ease of timing closure to the memory repair system illustrated in FIG. 1. The flip-flop 128A provides an ability to absorb the process variation margins introduced in the integrated circuit 100 without significant additional costs. In one embodiment, the memory wrappers 104-114 in the integrated circuit 100 are implemented without flip-flops. The multiplexer 129A receives the flip-flop signal from the flip-flop 128A and a fuse register signal from the fuse register 124A. The multiplexer 129A generates an output signal in response to the bypass data in the bypass register 126A. When the bypass data in the bypass register 126A is equal to the index value i.e. when the memory wrapper 104 is defective, the output signal of the multiplexer 129A is the fuse register signal. When the bypass data in the bypass register 126A is not equal to the index value i.e. the memory wrapper 104 is non-defective, the clock-gate 127A is inactivated. As a result, the memory clock 136 is not provided to the fuse register 124A, thus inactivating the fuse register 124A. In this case, the output signal of the multiplexer 129A is the flip-flop signal or the repair data on the memory data chain 132. Thus, when the memory wrapper 104 is non-defective, the repair data on the memory data chain 132 is directly sent as the output signal thus bypassing the fuse register 124A in the memory wrapper 104. This reduces the activation time of the integrated circuit 100 as the memory wrappers that are non-defective are kept out of the memory data chain 132 used for repairing the plurality of memory wrappers 102. The output signal of the multiplexer 129A is provided on the memory data chain 132. Thus, when the fuseROM controller 140 loads the repair data on the memory data chain 132, the repair data is shifted on the memory data chain 132 to be loaded in the fuse register of each defective memory wrapper whereas the fuse register of each non-defective memory wrapper is bypassed. The flip-flop 128A prevents combinational feed-through path from the input point of memory data chain 132 in the memory wrapper 104 to the point of output signal generation in the memory wrapper 104.

The operation of the circuit illustrated in FIG. 1 is explained now. Initially, the memory repair system in an integrated circuit (IC) 100 is reset. The memory bypass storage 152 stores a bypass data corresponding to each memory wrapper of the plurality of memory wrappers 102. The fuseROM controller 140 loads the bypass data in the memory bypass chain 134. The bypass data indicates a defective memory wrapper. The fuseROM controller 140 loads the bypass data stored in the memory bypass storage 152 in the corresponding bypass register of each memory wrapper. In one embodiment, the size of bypass register is one bit. In one embodiment, the fuseROM controller 140 maintains a look-up table of bypass data location in the memory bypass storage 152 corresponding to the bypass register in each of the plurality of memory wrappers 102. The memory data storage 154 stores a repair data corresponding to each defective memory wrapper. The memory data chain 132 links the fuse registers 124A, 124B, 124C, 124D, 124E and 124F in the plurality of memory wrappers 102 with the fuseROM controller 140. The memory data chain 132 is re-configured to link the fuse registers in a set of defective memory wrappers responsive to the bypass data loaded in the memory bypass chain 134. The provision of storing repair data only for the set of defective memory wrappers allows reduction in fuseROM 150 area required for memory repair.

The memory data chain 132 is connected to the fuse registers 124A, 124B, 124C, 124D, 124E and 124F in a daisy chain fashion. Similarly, the memory bypass chain 134 is connected to the bypass registers 126A, 126B, 126C, 126D, 126E and 126F in a daisy chain fashion. In one embodiment, the memory data chain 132 and the memory bypass chain 134 are connected in one to one fashion with the respective registers. In another embodiment, the memory data chain 132 and the memory bypass chain 134 are connected to the respective registers for optimum performance of the memory repair system on the IC 100. The memory bypass chain 134 and the memory data chain 132 may be multiplexed over a single physical pin of the fuseROM controller 140. In one embodiment, the fuseROM controller 140 reads the memory bypass storage 152 of the fuseROM 150 and shifts the bypass data in the memory bypass chain 134. The bypass data gets loaded in the bypass registers of the respective memory wrappers. Once the entire bypass data is shifted into the bypass registers, the memory data chain is re-configured to link only the set of defective memory wrappers. The repair data corresponding to the set of defective memory wrappers is then shifted in the memory data chain 132 by the fuseROM controller 140. The fact that the memory data chain 132 is re-configured to link only the set of defective memory wrappers allows reduction in activation time of the integrated circuit. The fuseROM controller 140 loads the repair data in the corresponding fuse register of each defective memory wrapper. In one embodiment, the fuseROM controller 140 maintains a lookup-table of repair data location in the memory data storage 154 corresponding to a fuse register in a defective memory wrapper of the set of defective memory wrappers. In one embodiment, the defective memory wrappers are activated in response to the bypass data loaded in the bypass register of each memory wrapper and the memory data chain loads the repair data corresponding to each defective memory wrapper in the fuse registers of the defective memory wrappers. In addition, storing repair data only for the set of defective memory wrappers allows reduction in fuseROM 150 area required for repairing the plurality of memory wrappers 102.

Figure 2A:
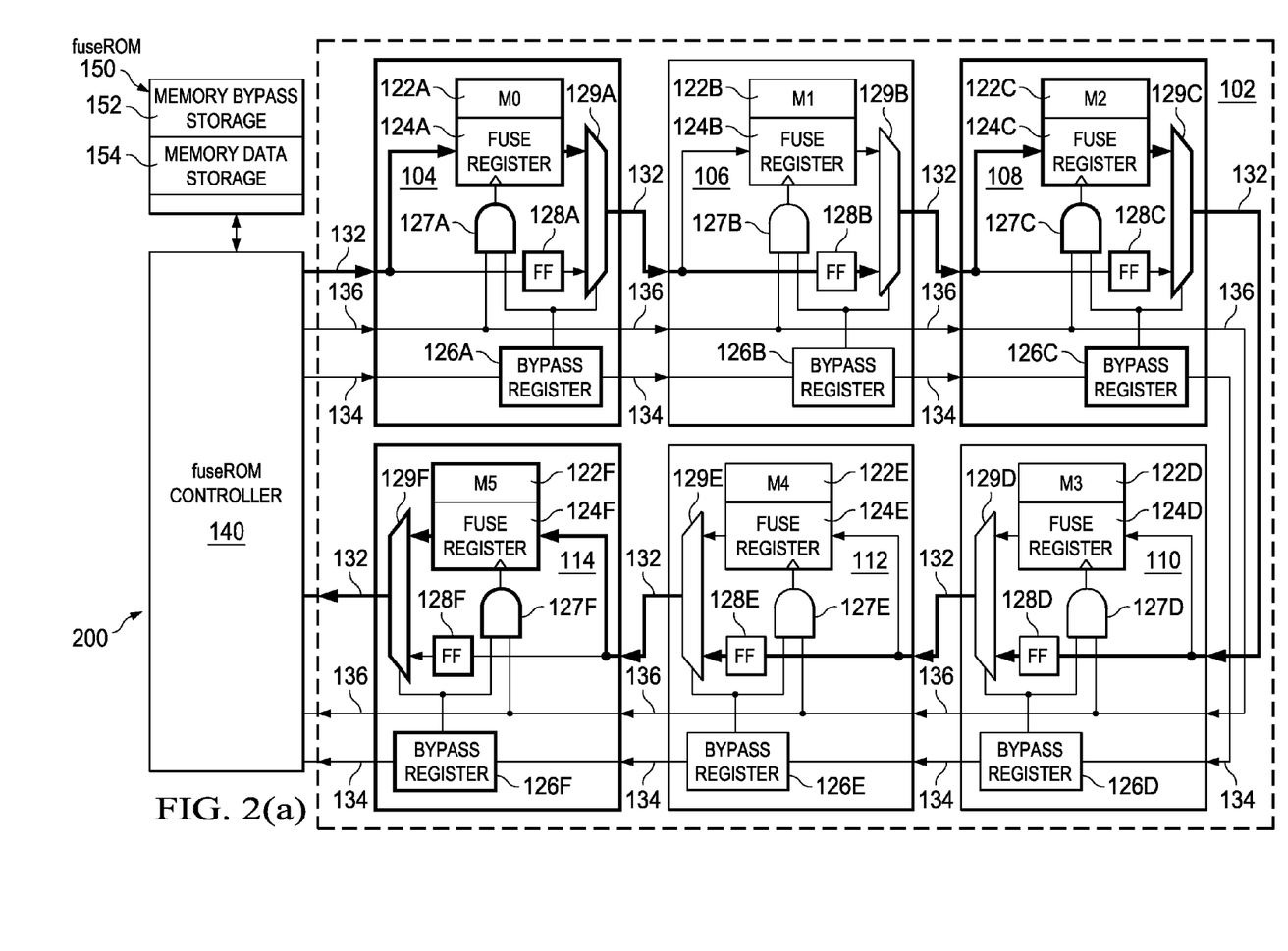
FIG. 2(a) illustrates a block diagram of a memory repair system in an integrated circuit (IC), according to an embodiment.
Figure 2B:
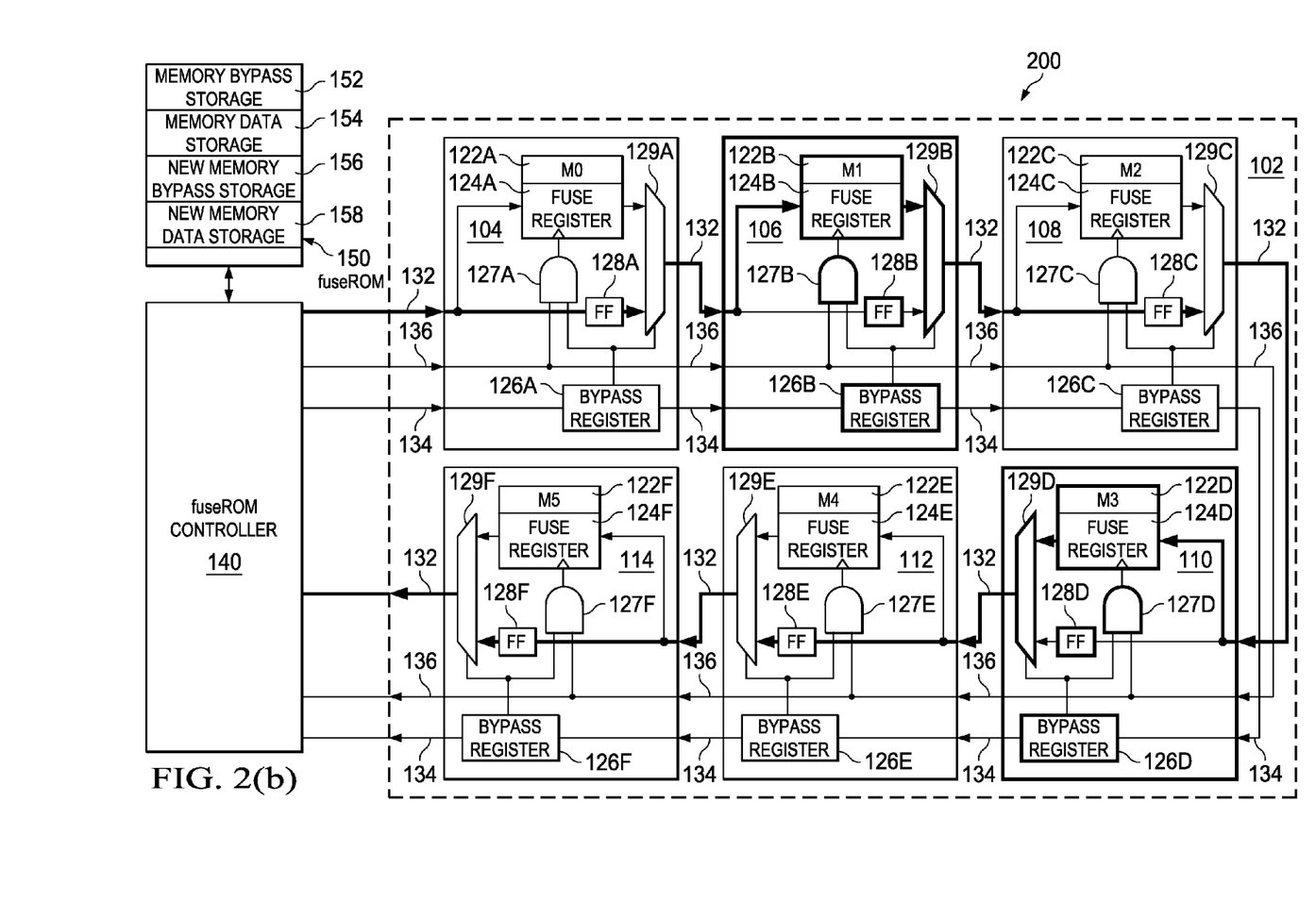
FIG. 2(b) illustrates the new defective memory wrappers after the testing phase, according to an embodiment.

FIG. 2(a) illustrates a block diagram of a memory repair system in an integrated circuit 200, according to an embodiment. The memory repair system in an integrated circuit 200 is similar in connection and operation to the memory repair system in an integrated circuit 100. The components of FIG. 2(a) that have identical reference numerals as those of FIG. 1 have same or similar functionalities as explained with respect to FIG. 1 and are therefore not explained again for brevity reasons. The memory bypass storage 152 stores a bypass data corresponding to each memory wrapper of the plurality of memory wrappers 102. The bypass data indicates a defective memory wrapper. The fuseROM controller 140 loads the bypass data stored in the memory bypass storage 152 in the corresponding bypass register of each memory wrapper. The memory data storage 154 stores a repair data corresponding to each defective memory wrapper. The FIG. 2(a) illustrates a later stage functionality of FIG. 1 in which the bypass data has been loaded in the bypass registers of the plurality of memory wrappers and memory wrapper 104, 108 and 114 are identified as defective. The memory data chain 132 is re-configured to link only the set of defective memory wrappers 104, 108 and 114 as illustrated in FIG. 2(*a*) with a thick marking. The non-defective memory wrappers 106, 110 and 112 are inactivated by inactivating the clock-gate 127B, 127D and 127E respectively. As a result, the memory clock 136 is not provided to the fuse register 124B, 124D and 124E, thus bypassing the non-defective memory wrappers 106, 110 and 112. The memory data storage 154 stores a repair data corresponding to the defective memory wrappers 104, 108 and 114. The repair data corresponding to the defective memory wrappers 104, 108 and 114 is then shifted in the memory data chain 132 by the fuseROM controller 140. After repairing of the defective memory wrappers 104, 108 and 114, the plurality of memory wrappers are again tested to identify one or more new defective memory wrappers. The testing is performed by an internal BIST (built-in self-test) circuit or by an external testing mechanism through a test interface on the IC 200 (not illustrated in Figures). FIG. 2(*b*) illustrates that after the testing phase, memory wrappers 106 and 110 are identified as new defective memory wrappers. A bypass data corresponding to each memory wrapper of the one or more memory wrapper is stored in the new memory bypass storage 156 and a repair data corresponding to the new defective memory wrappers 106 and 110 is stored in the new memory data storage 158. The fuseROM controller 140 loads the bypass data stored in the new memory bypass storage 152 in the corresponding bypass register of each memory wrapper of the plurality of memory wrappers 102. The memory data chain 132 is re-configured to link only the set of new defective memory wrappers 106 and 110 as illustrated in FIG. 2(*b*) with a thick marking. The non-defective memory wrapper 112 and the previously repaired memory wrappers 104, 108 and 114 are inactivated by inactivating the clock-gate 127A, 127C, 127E and 127F respectively. As a result, the memory clock 136 is not provided to the fuse register 124A, 124C, 124E and 124F, thus bypassing the non-defective memory wrapper 112 and the previously repaired memory wrappers 104, 108 and 114. The new memory data storage 158 stores a repair data corresponding to the new defective memory wrappers 106 and 110. The repair data corresponding to the new defective memory wrappers 106 and 110 is then shifted in the memory data chain 132 by the fuseROM controller 140 to perform incremental repair of the new defective memory wrappers 106 and 110.

Figure 3:
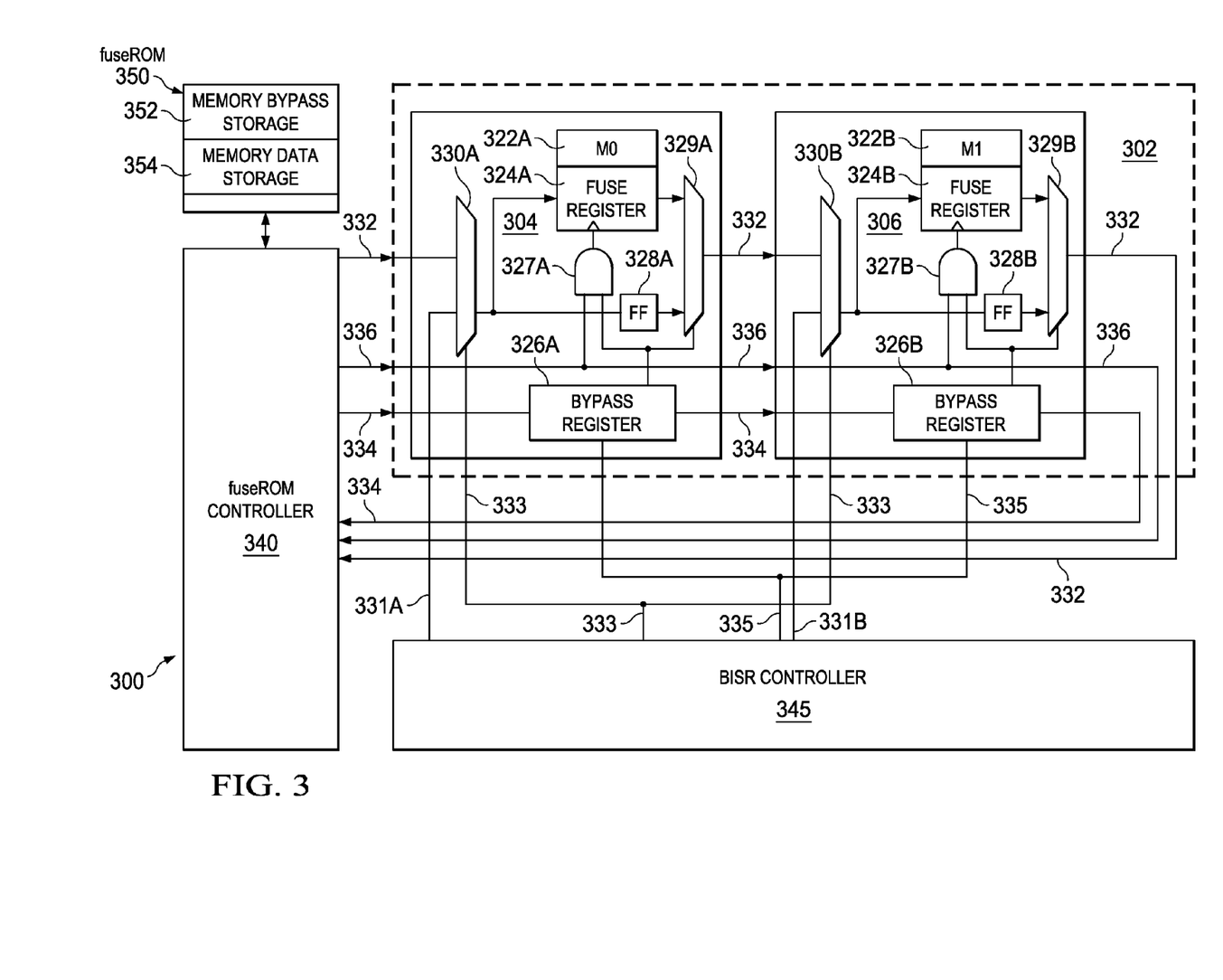
FIG. 3 illustrates a block diagram of a memory repair system in an integrated circuit (IC), according to an embodiment.

FIG. 3 illustrates a block diagram of a memory repair system in an integrated circuit (IC) 300, according to an embodiment. The IC 300 includes a plurality of memory wrappers 302, for example memory wrapper 304 and 306. For illustration purpose and ease of understanding, only two memory wrappers are used for explaining the functionality of memory repair system. Each memory wrapper includes a memory block e.g. memory blocks M0 322A and M1 322B. As illustrated, the memory wrapper 304 includes a memory block M0 322A and memory wrapper 306 includes a memory block M1 322B. In another embodiment, each memory wrapper includes a plurality of memory blocks. Each memory block has a fuse register e.g. fuse register 324A and 324B. Each memory wrapper also includes a bypass register e.g. bypass register 326A and 326B. Each memory wrapper includes a clock-gate e.g. clock-gate 327A and 327B. The clock-gate 327A receives an output of the bypass register 326A and a memory clock 336 form the fuseROM controller 340. The fuse register 324A receives the memory clock 336 through the clock-gate 327A. A BISR (built-in self-repair) controller 345 is coupled to each memory wrapper of the plurality of memory wrappers 302. As illustrated, the BISR controller 345 is coupled to the memory wrapper 304 and memory wrapper 306. In one embodiment, the BISR controller 345 is coupled to a set of memory wrappers. Each memory wrapper includes a first multiplexer e.g. multiplexer 330A and 330B. The first multiplexer 330A receives a repair data on the memory data chain 332 and a repair data on repair load chain 331A. The first multiplexer generates a first mux output in response to a BISR (built-in self-repair) selection signal 333 received from the BISR controller 345. Each memory wrapper includes a flip-flop e.g. flip-flop 328A and 328B.

Each memory wrapper includes a second multiplexer e.g. multiplexer 329A and 329B. The second multiplexer 329A receives an output of the flip-flop 328A and an output of the fuse register 324A. The second multiplexer 329A is configured to generate an output signal in response to an output of the bypass register 326A. A memory data chain 332 links the fuseROM controller 340 to the fuse registers 324A and 324B in the plurality of memory wrappers 302. The memory data chain 332 serves as an input to the first multiplexers 330A and 330B. A memory bypass chain 334 is configured to link the fuseROM controller 340 to the bypass registers 326A and 326B in the plurality of memory wrappers 302. The memory clock 336 is provided to the clock-gates 327A and 327B in the plurality of memory wrappers 302. A fuseROM 350 is coupled to the fuseROM controller 340. The fuseROM 350 includes a memory bypass storage 352 and a memory data storage 354. Additionally, embodiments including the integrated circuit 300 with a single memory wrapper are contemplated. The integrated circuit 300 may include one or more additional components known to those skilled in the relevant art and are not discussed here for simplicity of the description.

The integrated circuit 300 is designed for any desired function, and includes circuitry and the plurality of memory blocks M0-M1 to implement that function. In one embodiment, the memory blocks M0-M1 are caches implemented in a microprocessor or other arrays implemented in the microprocessor (e.g. translation lookaside buffers etc.). In an alternative embodiment, the integrated circuit 300 includes one or more processors and supporting circuitry (e.g. the fuseROM controller 340) in an integrated processor configuration (e.g. a microcontroller or embedded processor). In such an implementation, the memory blocks M0-M1 include caches or other memories for the processor, memories for the supporting circuitry, etc. In another embodiment, one or more processors and one or more peripheral circuits (e.g. I/O interface circuits or integrated I/O peripherals) are included in an SOC configuration. The memory blocks M0-M1 would then include caches or other memories for the processor, memories for the peripheral circuits, etc. In an embodiment, the integrated circuit 300 includes no processors and is a fixed-function integrated circuit such as an application specific integrated circuit (ASIC). The memory blocks M0-M1 in this case are arrays used by the fixed-function circuitry. Generally, as used herein, a memory is any storage implemented on an integrated circuit. For example, memory includes SRAM, DRAM, DDR memory, SDRAM, etc. In an embodiment, the memory blocks M0-M1 are different from each other i.e. for example memory block M0 is SRAM memory and memory blocks M1 is DDR memory.

The BISR controller 345 performs self-repair of the plurality of memory wrappers 302. The BISR controller 345 is configured to generate a bypass data for each memory wrapper of the plurality of memory wrappers 302 and store the bypass data in the corresponding bypass register of each memory wrapper. For example, the bypass data generated by the BISR controller 345 is stored in the bypass registers 326A and 326B. The bypass data indicates if a memory wrapper is defective. The BISR controller 345 generates a repair data corresponding to each defective memory wrapper of the plurality of memory wrappers 302 and stores the repair data in the corresponding fuse register of the defective memory wrapper. For example, if the bypass data indicates that the memory wrapper 304 is non-defective and the memory wrapper 306 is defective, then the BISR controller 345 generates repair data only for defective memory wrapper 306 and stores in the fuse register 324B. The BISR controller 345 generates the bypass data and the repair data for the memory wrapper 304 before generating the bypass data and the repair data for the memory wrapper 306. In one embodiment, the BISR controller 345 generates the bypass data and the repair data for a set of memory wrappers. The BISR controller 345 activates the fuseROM controller 340 to blow one or more fuses of the fuseROM 350 to store the repair data corresponding to each defective memory wrapper in the memory data storage 354 of the fuseROM 350. The fuseROM controller 340 copies the repair data from the fuse registers of the defective memory wrappers to the memory data storage 354 and erases the fuse registers. For example, when the memory wrapper 306 is defective, the fuseROM controller 340 copies the repair data from the fuse register 324B to the memory data storage 354 and erases the fuse register 324B. The BISR controller 345 activates the fuseROM controller 340 to store the bypass data corresponding to each memory wrapper in the memory bypass storage 352 of the fuseROM 350. The fuseROM controller 340 copies the bypass data from the bypass registers of each memory wrapper to the memory bypass storage 352 and erases the bypass registers. For example, the fuseROM controller 340 copies the bypass data from the bypass registers 326A and 326B to the memory bypass storage 352 and erase the bypass registers 326A and 326B.

To further illustrate the functioning of the memory repair system on integrated circuit 300, the functioning at memory wrapper level is explained now. Each memory wrapper of the plurality of memory wrappers 302 is similar in connections and operation. Therefore, the operation of memory wrapper 304 is explained now and the operation of the other memory wrappers is not discussed here for simplicity of the description.

On activation of the integrated circuit 300, the BISR controller 345 performs self repair of the plurality of memory wrappers 302. The BISR controller 345 is configured to generate a bypass data for the memory wrapper 304. The BISR controller 345 stores the bypass data in the bypass register 326A through the bypass load chain 335. The bypass data in the bypass register 326A indicates if the memory wrapper 304 is defective. If the memory wrapper 304 is defective, the BISR controller 345 generates a repair data for the memory wrapper 304. Otherwise, if the memory wrapper 304 is non-defective, the BISR controller 345 self repair the next memory wrapper i.e. memory wrapper 306. When the memory wrapper 304 is defective, the BISR controller 345 generates a repair data for the memory wrapper 304. The BISR controller 345 activates a BISR selection signal 333 to a first multiplexer 330A. The memory wrapper 304 includes a clock-gate 327A that receives the memory clock 336. The memory clock 336 is used to clock the fuse register 324A in response to the bypass data in the bypass register 326A. The clock-gate 327A is activated to provide memory clock 336 to the fuse register 324A when the bypass data in the bypass register indicates that the memory wrapper 304 is defective. When the bypass data in the bypass register 326A is equal to an index value, the memory wrapper 304 is defective. The bypass data in the bypass register 326A is compared with the index value to identify a defective memory wrapper. In one embodiment, the index value is a set of bits predefined in the IC 300. In response to the BISR selection signal 333, the first multiplexer 330A generates a first mux output which is the repair data on the repair load chain 331A from the BISR controller 345. The repair data is then stored in the fuse register 324A. The second multiplexer 329A is inactivated when the repair data is stored in the fuse register 324A. After generating the bypass data for each memory wrapper and the repair data for each defective memory in the plurality of memory wrappers 302, the BISR controller 345 activates the fuseROM controller 340 to blow one or more fuses of the fuseROM 350 to store the repair data corresponding to each defective memory wrapper in the memory data storage 354 of the fuseROM 350. The fuseROM controller 340 copies the repair data from the fuse register 324A of the defective memory wrapper 304 to the memory data storage 354 and erase the fuse register 324A. The BISR controller 345 activates the fuseROM controller 340 to store the bypass data corresponding to each memory wrapper in the memory bypass storage 352 of the fuseROM 350. The fuseROM controller 340 copies the bypass data from the bypass register 326A of memory wrapper 304 to the memory bypass storage 352 and erases the bypass register 326A.

The memory bypass chain 334 links the fuseROM controller 340 to the bypass register 326A. The memory bypass storage 352 stores a bypass data corresponding to each memory wrapper of the plurality of memory wrappers 302. The memory bypass storage 352 stores a bypass data corresponding to the memory wrapper 304. When the memory repair system in an integrated circuit (IC) 300 is reset, the fuseROM controller 340 loads the bypass data from the memory bypass storage 352 in the bypass register 326A. The bypass data in the bypass register 326A indicates if the memory wrapper 304 is defective. The memory data chain 332 links the fuseROM controller 340 to the fuse register 324A through the first multiplexer 330A. The memory data storage 354 stores a repair data corresponding to each defective memory wrapper. The memory data storage 354 stores a repair data corresponding to the memory wrapper 304 if the bypass data in the bypass register 326A indicates that the memory wrapper 304 is defective. In one embodiment, the index value is a set of bits predefined in the IC 300. When the bypass data in the bypass register 326A is equal to an index value; the memory wrapper 304 is defective. The BISR controller 345 activates a BISR selection signal 333 to select the memory data chain 332. The memory clock 336 is used to clock the fuse register 324A in response to the bypass data in the bypass register 326A. The clock-gate 327A is activated to provide memory clock 336 to the fuse register 324A when the bypass data in the bypass register 326A indicates that the memory wrapper 304 is defective. In response to the BISR selection signal 333, the first multiplexer 330A generates a first mux output which is the repair data on the memory data chain 332 from the fuseROM controller 340. The repair data is stored in the fuse register 324A.

The repair data on the memory data chain 332 is provided to the flip-flop 328A that generates a flip-flop signal. The flip-flop signal is the same as the repair data on the memory data chain 332 as the function of the flip-flop 328A is just to add delay to the repair data by a predefined time period. The flip-flop 328A provides ease of timing closure to the memory repair system illustrated in FIG. 3. The flip-flop 328A provides an ability to absorb the process variation margins introduced in the integrated circuit 300 without significant additional costs. In one embodiment, the memory wrappers 304 and 306 in the integrated circuit 300 are implemented without flip-flops 328A and 328B respectively. The second multiplexer 329A receives the flip-flop signal from the flip-flop 328A and a fuse register signal from the fuse register 324A. The second multiplexer 329A generates an output signal in response to the bypass data in the bypass register 326A. When the bypass data in the bypass register 326A is equal to the index value i.e. when the memory wrapper 304 is defective, the output signal of the second multiplexer 329A is the fuse register signal. When the bypass data in the bypass register 326A is not equal to the index value i.e. the memory wrapper 304 is non-defective, the clock-gate 327A is inactivated. As a result, the memory clock 336 is not provided to the fuse register 324A, thus inactivating the fuse register 324A. In this case, the output signal of the second multiplexer 329A is the flip-flop signal or the repair data on the memory data chain 332. Thus, when the memory wrapper 304 is non-defective, the repair data on the memory data chain 332 is directly sent as the output signal thus bypassing the fuse register 324A in the memory wrapper 304. This reduces the activation time of the integrated circuit 300 as the memory wrappers that are non-defective are kept out of the memory data chain 332 used for repairing the plurality of memory wrappers 302. The output signal of the second multiplexer 329A is provided on the memory data chain 332. Thus, when the fuseROM controller 340 loads the repair data on the memory data chain 332, the repair data is shifted on the memory data chain 332 to be loaded in the fuse register of each defective memory wrapper whereas the fuse register of each non-defective memory wrapper is bypassed. The flip-flop 328A prevents combinational feed-through path from the input point of memory data chain 332 in the memory wrapper 304 to the point of output signal generation in the memory wrapper 304.

The operation of the circuit (illustrated in FIG. 3) after self repair by BISR controller 345 is explained now. The memory bypass storage 352 stores a bypass data corresponding to each memory wrapper of the plurality of memory wrappers 302. The fuseROM controller 340 loads the bypass data in the memory bypass chain 334. The bypass data indicates a defective memory wrapper. The fuseROM controller 340 loads the bypass data stored in the memory bypass storage 352 in the corresponding bypass register of each memory wrapper. In one embodiment, the size of bypass register is one bit. In one embodiment, the fuseROM controller 340 maintains a lookup table of bypass data location in the memory bypass storage 352 corresponding to the bypass register in each of the plurality of memory wrappers 302. The memory data storage 354 stores a repair data corresponding to each defective memory wrapper. The memory data chain 332 links the fuse registers in the plurality of memory wrappers 302 with the fuseROM controller 340. The memory data chain 332 is re-configured to link the fuse registers in a set of defective memory wrappers responsive to the bypass data loaded in the memory bypass chain 334. In one embodiment, the defective memory wrappers are activated in response to the bypass data loaded in the bypass register of each memory wrapper and the memory data chain loads the repair data corresponding to each defective memory wrapper in the fuse registers of the defective memory wrappers. The provision of storing repair data only for the set of defective memory wrappers allows reduction in fuseROM 350 area required for memory repair.

The memory data chain 332 is connected to the fuse registers 324A and 324B in a daisy chain fashion. Similarly, the memory bypass chain 334 is connected to the bypass registers 326A and 326B in a daisy chain fashion. In one embodiment, the memory data chain 332 and the memory bypass chain 334 are connected in one to one fashion with the respective registers. In another embodiment, the memory data chain 332 and the memory bypass chain 334 are connected to the respective registers for optimum performance of the memory repair system on the IC 300. The memory bypass chain 334 and the memory data chain 332 may be multiplexed over a single physical pin of the fuseROM controller 340. In one embodiment, the fuseROM controller 340 reads the memory bypass storage 352 of the fuseROM 350 and shifts the bypass data in the memory bypass chain 334. The bypass data gets loaded in the bypass registers of the respective memory wrappers. Once the entire bypass data is shifted into the bypass registers, the memory data chain is re-configured to link only the set of defective memory wrappers. The repair data corresponding to the set of defective memory wrappers is then shifted in the memory data chain 332 by the fuseROM controller 340. The fact that the memory data chain 332 is re-configured to link only the set of defective memory wrappers allows reduction in activation time of the integrated circuit 300. The fuseROM controller 340 loads the repair data in the corresponding fuse register of each defective memory wrapper. In one embodiment, the fuseROM controller 340 maintains a lookup-table of repair data location in the memory data storage 354 corresponding to a fuse register in a defective memory wrapper of the set of defective memory wrappers. In addition, storing repair data only for the set of defective memory wrappers allows reduction in fuseROM 350 area required for repairing the plurality of memory wrapper 302. The concept of increment repair of the plurality of memory wrappers illustrated in FIG. 2(a) and FIG. 2(b) is applicable to the IC 300 as well.

Figure 4:
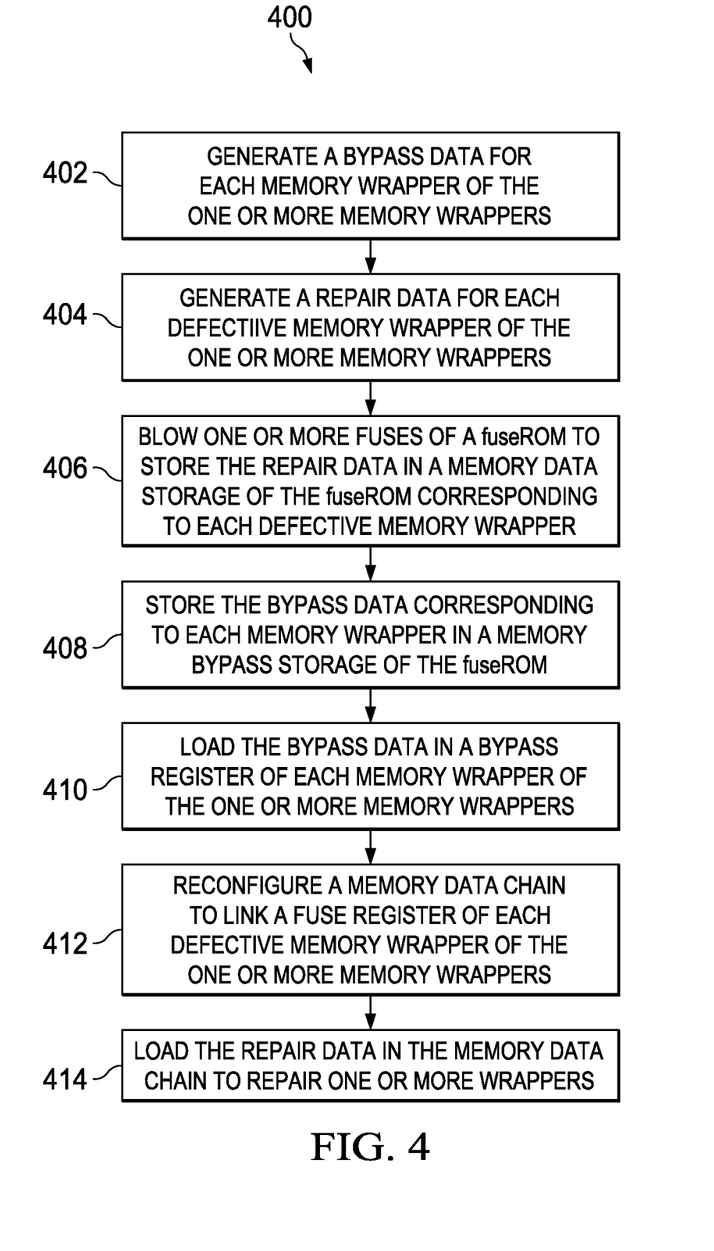
FIG. 4 is a flow diagram illustrating a memory repair system for testing one or more memory wrappers on an integrated circuit, according to an embodiment.

FIG. 4 is a flow diagram 400 illustrating a memory repair system for testing one or more memory wrappers on the integrated circuit 300, according to an embodiment. At step 402, a bypass data is generated for each memory wrapper of the one or more memory wrappers. The bypass data is configured to indicate if a memory wrapper is defective. At step 404, a repair data is generated corresponding to each defective memory wrapper of the one or more memory wrappers. At step 406, one or more fuses of a fuseROM are blown to store the repair data in a memory data storage of the fuseROM corresponding to each defective memory wrapper. At step 408, the bypass data corresponding to each memory wrapper is stored in a memory bypass storage of the fuseROM. The bypass data is loaded in a bypass register of each memory wrapper of the one or more memory wrappers at step 410. A memory data chain is configured to link the fuse registers in each memory wrapper of the one or more memory wrappers. At step 412, the memory data chain is reconfigured to link the fuse register of each defective memory wrapper of the one or more memory wrappers in response to the bypass data loaded in the bypass registers of the one or more memory wrappers. The repair data is loaded in the memory data chain to repair one or more memory wrappers at step 414.

In the foregoing discussion, the terms "connected" means at least either a direct electrical connection between the devices connected or an indirect connection through one or more passive intermediary devices. The term "circuit" means at least either a single component or a multiplicity of passive components, that are connected together to provide a desired function. The term "signal" means at least one current, voltage, charge, data, or other signal.

It should be noted that reference throughout this specification to features, advantages, or similar language does not imply that all of the features and advantages should be or are in any single embodiment. Rather, language referring to the features and advantages is understood to mean that a specific feature, advantage, or characteristic described in connection with an embodiment is included in at least one embodiment of the present disclosure. Thus, discussion of the features and advantages, and similar language, throughout this specification may, but do not necessarily, refer to the same embodiment.

Further, the described features, advantages, and characteristics of the disclosure may be combined in any suitable manner in one or more embodiments. One skilled in the relevant art will recognize that the disclosure can be practiced without one or more of the specific features or advantages of a particular embodiment. In other instances, additional features and advantages may be recognized in certain embodiments that may not be present in all embodiments of the disclosure.

One having ordinary skill in the art will understand that the present disclosure, as discussed above, may be practiced with steps and/or operations in a different order, and/or with hardware elements in configurations which are different than those which are disclosed. Therefore, although the disclosure has been described based upon these preferred embodiments, it should be appreciated that certain modifications, variations, and alternative constructions are apparent and well within the spirit and scope of the disclosure. In order to determine the metes and bounds of the disclosure, therefore, reference should be made to the appended claims.

What is claimed is:

1. An integrated circuit comprising:
a plurality of memory wrappers, each memory wrapper comprising a memory block with a fuse register and a bypass register, the bypass register having a bypass data that is configured to indicate a defective memory wrapper of the plurality of memory wrappers;
a fuseROM controller coupled to the plurality of memory wrappers;
a memory bypass chain configured to link the bypass registers in the plurality of memory wrappers with the fuseROM controller, wherein the fuseROM controller is configured to load the bypass data in the memory bypass chain; and
a memory data chain configured to link the fuse registers in the plurality of memory wrappers with the fuseROM controller, wherein the memory data chain is re-configured to link the fuse registers in a set of defective memory wrappers of the plurality of memory wrappers responsive to the bypass data loaded in the memory bypass chain.

2. The integrated circuit of claim 1 further comprising a fuseROM coupled to the fuseROM controller, wherein the fuseROM comprises a memory data storage configured to store a repair data corresponding to each defective memory wrapper and a memory bypass storage configured to store the bypass data corresponding to each memory wrapper.

3. The integrated circuit of claim 1, wherein the memory data chain is re-configured to link only the set of defective memory wrappers such that an activation time of the integrated circuit is reduced.

4. The integrated circuit of claim 1, wherein the memory data storage is configured to store the repair data corresponding to each defective memory wrapper such that a fuseROM area is reduced.

5. The integrated circuit of claim 1, wherein the fuseROM controller is configured to load the repair data in the corresponding fuse register of each defective memory wrapper.

6. The integrated circuit of claim 1, wherein the fuseROM controller is configured to load the bypass data in the corresponding bypass register of each of the plurality of memory wrappers.

7. The integrated circuit of claim 1, wherein each memory wrapper further comprises:
a clock-gate configured to provide a memory clock to the fuse register when the bypass data in the bypass register is equal to an index value, wherein the fuse register is configured to receive the repair data on the memory data chain and configured to generate a fuse register signal and wherein the memory wrapper is defective when the bypass data in the bypass register is equal to the index value; and
a multiplexer configured to receive the repair data and the fuse register signal to generate an output signal in response to the bypass data in the bypass register, wherein the output signal is the fuse register signal when the bypass data in the bypass register is equal to an index value and the output signal is the repair data when the bypass data in the bypass register is not equal to the index value.

8. The integrated circuit of claim 7, wherein:
the multiplexer generates an output signal from a flip-flop signal and the fuse register signal in response to the bypass data in the bypass register; and
the flip-flop signal is generated from the repair data.

9. An integrated circuit comprising:
a plurality of memory wrappers, each memory wrapper comprises a memory block with a fuse register and a bypass register, the bypass register having a bypass data that is configured to indicate a defective memory wrapper of the plurality of memory wrappers;
a BISR (built-in self-repair) controller coupled to each memory wrapper of the plurality of memory wrappers and configured to self repair each memory wrapper;
a fuseROM controller coupled to the BISR controller and to the plurality of memory wrappers;
a fuseROM coupled to the fuseROM controller, wherein the fuseROM comprises a memory data storage configured to store a repair data corresponding to each defective memory wrapper and a memory bypass storage configured to store the bypass data corresponding to each memory wrapper;
a memory bypass chain configured to link the bypass registers in the plurality of memory wrappers with the fuseROM controller, wherein the fuseROM controller is configured to load the bypass data in the memory bypass chain; and
a memory data chain configured to link the fuse registers in the plurality of memory wrappers with the fuseROM controller, wherein the memory data chain is re-configured to link the fuse registers in a set of defective memory wrappers of the plurality of memory wrappers responsive to the bypass data loaded in the memory bypass chain.

10. The integrated circuit of claim 9, wherein the self repair of each memory wrapper requires a BISR controller to:
generate the bypass data for each memory wrapper of the plurality of memory wrappers and store the bypass data in the corresponding bypass register of each memory wrapper;
generate the repair data for each defective memory wrapper and store the repair data in the corresponding fuse register of the defective memory wrapper;
activate the fuseROM controller to blow one or more fuses of the fuseROM to store the repair data corresponding to each defective memory wrapper in the memory data storage of the fuseROM and erase the fuse register of each defective memory wrapper; and activate the fuseROM controller to store the bypass data corresponding to each memory wrapper in the memory bypass storage of the fuseROM and erase the bypass register of each memory wrapper.

11. The integrated circuit of claim 9, wherein the memory wrapper further comprises:
a first multiplexer configured to receive the repair data from the fuseROM controller and the repair data from the BISR controller and configured to generate a first mux output in response to a BISR selection signal, wherein the first mux output is the repair data from the BISR controller during self repair of the memory wrapper;
a clock-gate configured to provide a memory clock to the fuse register when the bypass data in the bypass register is equal to an index value, wherein the fuse register is configured to receive the first mux output and generate a fuse register signal, and wherein the memory wrapper is defective when the bypass data in the bypass register is equal to the index value; and
a second multiplexer configured to receive the first mux output and the fuse register signal to generate an output signal in response to the bypass data in the bypass register, wherein the output signal is the fuse register signal when the bypass data in the bypass register is equal to an index value and the output signal is the repair data when the bypass data in the bypass register is not equal to the index value.

12. A method of repairing one or more memory wrappers on an integrated circuit comprising:
storing a bypass data corresponding to each memory wrapper of the one or more memory wrappers in a memory bypass storage, wherein the bypass data is configured to indicate a defective memory wrapper of the one or more memory wrappers;
storing a repair data corresponding to each defective memory wrapper in a memory data storage;
loading the bypass data in a memory bypass chain, wherein the memory bypass chain is configured to link the bypass register of each memory wrapper of the one or more memory wrappers; and
loading the repair data in a memory data chain configured to link each defective memory wrapper of the one or more memory wrappers.

13. The method of claim 12, wherein loading the repair data in a memory data chain further comprising configuring the memory data chain to link each memory wrapper of the one or more memory wrapper and re-configuring the memory data chain to link each defective memory wrapper of the one or more memory wrappers responsive to the bypass data loaded in the memory bypass chain such that an activation time of the integrated circuit is reduced.

14. The method of claim 12 further comprising activating a defective memory wrapper responsive to the bypass data in the bypass register of each memory wrapper and configuring the memory data chain to load a repair data corresponding to the defective memory wrapper in a fuse register of the defective memory wrapper.

15. The method of claim 14, wherein activating the defective memory wrapper further comprises:
comparing the bypass data in the bypass register and an index value;
providing a memory clock to the fuse register when the bypass data in the bypass register is equal to the index value, wherein the memory wrapper is defective when the bypass data in the bypass register is equal to the index value;
loading the repair data on the memory data chain in the fuse register of the defective memory wrapper to generate a fuse register signal; and
multiplexing the repair data and the fuse register signal to generate an output signal in response to the bypass data in the bypass register.

16. The method of claim 15 further comprising multiplexing a flip-flop signal and the fuse register signal to generate the output signal, wherein the flip-flop signal is generated from the repair data.

17. A method of self repairing one or more memory wrappers on an integrated circuit comprising:
generating a bypass data for each memory wrapper of the one or more memory wrappers, wherein the bypass data is configured to indicate a defective memory wrapper;
generating a repair data for each defective memory wrapper of the one or more memory wrappers;
blowing one or more fuses of a fuseROM to store the repair data corresponding to each defective memory wrapper in a memory data storage of the fuseROM;
storing the bypass data corresponding to each memory wrapper in a memory bypass storage of the fuseROM;
loading the bypass data in a bypass register of each memory wrapper of the one or more memory wrappers; and
loading the repair data in a memory data chain configured to link each defective memory wrapper of the one or more memory wrappers.

18. A method of incremental repairing one or more memory wrappers on an integrated circuit comprising:
storing a bypass data corresponding to each memory wrapper of the one or more memory wrapper in a memory bypass storage, wherein the bypass data is configured to indicate a defective memory wrapper;
storing a repair data corresponding to each defective memory wrapper in a memory data storage;
loading the bypass data in a bypass register of each memory wrapper of the one or more memory wrappers;
loading the repair data in a memory data chain configured to link each defective memory wrapper of the one or more memory wrappers;
testing the one or more memory wrappers to identify one or more new defective memory wrappers;
storing a bypass data corresponding to each memory wrapper of the one or more memory wrapper in a new memory bypass storage, wherein the bypass data is configured to indicate if a memory wrapper is defective;
storing a repair data corresponding to each new defective memory wrapper of the one or more new defective memory wrappers in a new memory data storage;
loading the bypass data in the bypass register of each memory wrapper of the one or more memory wrappers; and
loading the repair data in a memory data chain configured to link each new defective memory wrapper of the one or more memory wrappers.

* * * * *